US010256152B2

(12) United States Patent
Gao et al.

(10) Patent No.: US 10,256,152 B2
(45) Date of Patent: Apr. 9, 2019

(54) METHODS OF MAKING FINFET DEVICE COMPRISING A PIEZOELECTRIC LINER FOR GENERATING A SURFACE CHARGE

(71) Applicant: GLOBALFOUNDRIES Inc., Grand Cayman (KY)

(72) Inventors: Qun Gao, Clifton Park, NY (US); Naved Siddiqui, Malta, NY (US); Anthony I. Chou, Beacon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 23 days.

(21) Appl. No.: 15/657,373

(22) Filed: Jul. 24, 2017

(65) Prior Publication Data
US 2019/0027601 A1    Jan. 24, 2019

(51) Int. Cl.
| | | |
|---|---|---|
| *H01L 21/76* | (2006.01) | |
| *H01L 21/8234* | (2006.01) | |
| *H01L 29/78* | (2006.01) | |
| *H01L 29/66* | (2006.01) | |
| *H01L 29/51* | (2006.01) | |

(Continued)

(52) U.S. Cl.
CPC ........... *H01L 21/823431* (2013.01); *H01L 21/76224* (2013.01); *H01L 21/823821* (2013.01); *H01L 27/0886* (2013.01); *H01L 27/0924* (2013.01); *H01L 27/1211* (2013.01); *H01L 29/1083* (2013.01); *H01L 29/41791* (2013.01); *H01L 29/516* (2013.01); *H01L 29/66795* (2013.01); *H01L 29/785* (2013.01); *H01L 29/7846* (2013.01); *H01L 29/7849* (2013.01)

(58) Field of Classification Search
CPC ........... H01L 29/7846; H01L 29/66795; H01L 29/785; H01L 29/1083; H01L 21/823821; H01L 21/823431; H01L 27/0924; H01L 27/0886; H01L 27/1211; H01L 21/76224; H01L 29/41791; H01L 29/516; H01L 29/0638; H01L 29/7849
See application file for complete search history.

(56) References Cited

U.S. PATENT DOCUMENTS 6,753,230 B2    6/2004    Sohn et al.
9,105,559 B2    8/2015    Basker et al.
(Continued)

OTHER PUBLICATIONS

Engelmark et al., "Structural and electroacoustic studies of AlN thin films during low temperature radio frequency sputter deposition," J. Vac. Sci. Technol. A, 19-2664-69, 2001.
(Continued)

*Primary Examiner* — Shouxiang Hu
(74) *Attorney, Agent, or Firm* — Amerson Law Firm, PLLC (57) ABSTRACT

One illustrative method disclosed herein includes, among other things, forming a conformal piezoelectric material liner layer on at least the opposing lateral sidewalls of a fin, forming a recessed layer of insulating material on opposite sides of the fin and on the conformal piezoelectric material liner layer, removing portions of the conformal piezoelectric material liner layer positioned above the recessed layer of insulating material to thereby expose a portion of the fin above the recessed upper surface, and forming a gate structure above the recessed layer of insulating material and around a portion of the fin positioned above the recessed upper surface.

15 Claims, 11 Drawing Sheets

(51) Int. Cl.
*H01L 29/10* (2006.01)
*H01L 29/417* (2006.01)
*H01L 27/092* (2006.01)
*H01L 27/088* (2006.01)
*H01L 27/12* (2006.01)
*H01L 21/762* (2006.01)
*H01L 21/8238* (2006.01)

(56) References Cited

U.S. PATENT DOCUMENTS

| | | | |
|---|---|---|---|
| 9,281,400 B1* | 3/2016 | Chiang | H01L 29/7848 |
| 9,514,995 B1* | 12/2016 | Fogel | H01L 21/823878 |
| 2016/0049335 A1* | 2/2016 | Liu | H01L 21/823431 |
| | | | 438/283 |
| 2018/0145133 A1* | 5/2018 | Loubet | H01L 21/823431 |
| 2018/0248015 A1 | 8/2018 | Glass et al. | |
| 2018/0315663 A1* | 11/2018 | Bao | H01L 21/823821 |

OTHER PUBLICATIONS

He et al., "FinFET Doping with PSG/BSG Glass Mimic doping by Ultra Low Energy Ion Implantation," 2016 IEEE.

Huang et al., "Effective Passivation of AlGaN/GaN HEMTs by ALD-Grown AlN Thin Film," IEEE Electron Device Letters, 33:516-18, 2012.

Kirste et al., "Polarity control and growth of lateral polarity structures in AlN," Applied Physics Letters, 102:181913, 2013.

Martin et al., "Thickness dependence of the properties of highly c-axis textured AlN thin films," J. Vac. Sci. Technol. A, 22(2):361-64, 2004.

Dasgupta et al., "Growth of high quality N-polar (AlN(0001) on Si(111) by plasma assisted molecular beam epitaxy," Applied Physics Letters, 94:151906, 2009.

Lee, "Bulk FinFETs: Design at 14 nm Node and Key Characteristics," Nano Devices and Circuit Techniques for Low-Energy Applications and Energy Harvesting, 291:33-64, 2016.

Translation of Examination Report from Taiwan Patent Application No. 107103086 dated Aug. 2, 2018.

* cited by examiner

METHODS OF MAKING FINFET DEVICE COMPRISING A PIEZOELECTRIC LINER FOR GENERATING A SURFACE CHARGE

BACKGROUND OF THE INVENTION

1. Field of the Invention

The present disclosure generally relates to the fabrication of integrated circuits, and, more particularly, to a FinFET device comprising a piezoelectric liner for generating a surface charge and methods of making such a device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

Figure 1:
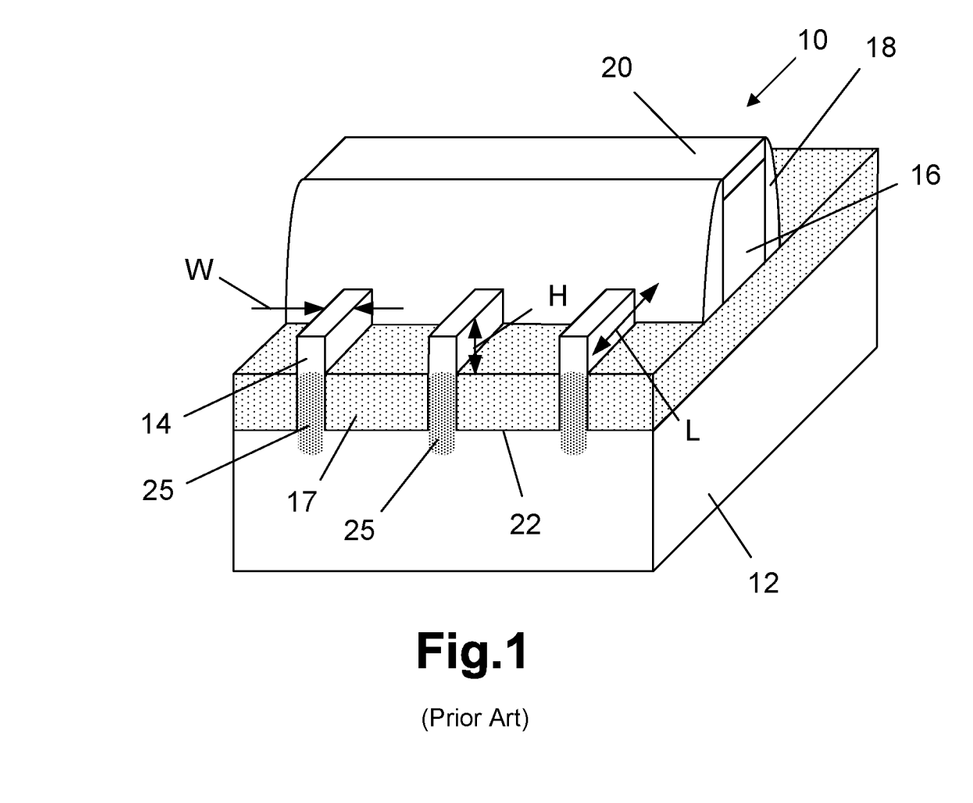
FIG. 1 is a simplistic depiction of an illustrative prior art FinFET device.

In contrast to a planar FET, which, as the name implies, is a generally planar structure, a so-called FinFET device has a three-dimensional (3D) structure. FIG. 1 is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate structure 16, a sidewall spacer 18 and a gate cap 20. Fin-formation trenches 22 were formed in the substrate 12 to define the fins 14. A recessed layer of insulating material 17 is positioned under the gate structure 16 and between the fins 14 in the areas outside of the gate structure, i.e., in the source/drain regions of the device 10. The gate structure 16 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device 10. The fins 14 have a three-dimensional configuration: a height H, a width W and an axial length L. The axial length L corresponds to the direction of current travel in the device 10 when it is operational, i.e., the gate length direction of the device. The portions of the fins 14 covered by the gate structure 16 are the channel regions of the FinFET device 10. The gate structures 16 for such FinFET devices 10 may be manufactured using so-called "gate-first" or "replacement gate" (gate-last) manufacturing techniques. A FinFET device may have either a tri-gate or dual-gate channel region. For a given plot space (or foot-print), FinFETs tend to be able to generate significantly higher drive current density than planar transistor devices.

One problem that is encountered in forming FinFET devices on bulk semiconductor substrates relates to preventing leakage currents between the source and drain regions when the device is off, which are referred to as so-called sub-threshold voltage leakage currents. One prior art effort to eliminate or reduce such undesirable sub-threshold voltage leakage currents involves performing an ion implantation process to form counter-doped punch through stopper (PTS) regions 25. Such PTS regions 25 are formed along the entire axial length of the fin 14 prior to the formation of the gate structure 16. In terms of vertical position, the PTS regions 25 are typically positioned just under the junction depth of the source/drain regions (not shown) that are formed in the portions of the fin 14 that are exposed above the upper surface of the recessed layer of insulating material 17 in the source/drain regions of the device.

For an N-type device 10, the PTS regions 25 were created by implanting a P-type dopant, and for a P-type device 10, the PTS regions 25 were created by implanting an N-type dopant. The implant process that is performed to create the PTS regions 25 is typically performed shortly after formation of the fins 14 and prior to formation of the gate structure 16. However, forming accurately positioned doped PTS regions 25 underneath the source/drain regions in the active fins 14 is very difficult when the PTS regions 25 are formed by performing an ion implantation process. More specifically, when the PTS regions 25 are formed by performing an ion implantation process, unwanted dopant materials will almost always be introduced into the active regions of the fins 14. Moreover, additional thermal heating processes that will be performed on the device after the formation of the PTS regions 25 will tend to drive dopant diffusion and shift the location of the PTS doped regions 25 and reduce the dopant concentration of the PTS regions 25 relative to what was anticipated by the original design process. In such cases, fine tuning of the ion implantation process that is performed to form the PTS regions 25 is required and such fine tuning is difficult to accomplish. If the dopant from the counter-doped PTS regions 25 diffuses into the fins 14 during subsequent annealing processes, it would cause threshold voltage fluctuation because of the random amount of the counter-dopant diffused into fins 14 of different devices, which will severely compromise the circuit performance. In an ideal device, there would be little to no dopant material present in the channel portion of the fin 14 that is covered by the gate structure 16. Such unwanted dopant material in the channel reduces the mobility of the charge carriers in the channel region and causes unwanted mismatches in the threshold voltages between different devices.

Another prior art technique for forming such PTS regions 25 involves depositing solid boron (B) or phosphorus (P) doped glass layers of silicon dioxide or forming doped spacers made of silicon dioxide adjacent the fins 14 and thereafter performing a heating process to drive the dopants in the layer of glass material or the spacer to migrate into the fins 14 at the desired location. After the dopant drive-in process is performed, the solid doped glass layer is striped off. This technique has good PTS location control and will generally not introduce any performance-limiting amounts of the driven dopant into active fins 14. However, the fine control of doping concentration necessary to perform such a technique is difficult to achieve. Moreover, subsequent thermal anneal processes that will be performed will also inevitably drive dopant into the active fin regions, causing threshold voltage mismatch and mobility degradation.

The present disclosure is directed to a FinFET device comprising a piezoelectric liner for generating a surface charge and methods of making such a device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a FinFET device comprising a piezoelectric liner for generating a surface charge and methods of making such a device. One illustrative method disclosed herein includes, among other things, forming a fin that comprises opposing lateral sidewalls, forming a conformal piezoelectric material liner layer on at least the opposing lateral sidewalls of the fin and forming a recessed layer of insulating material in the fin-formation trenches on opposite sides of the fin and on the conformal piezoelectric material liner layer. In this example, the method further includes removing portions of the conformal piezoelectric material liner layer positioned above the recessed layer of insulating material to thereby expose a portion of the fin above the recessed upper surface and forming a gate structure above the recessed layer of insulating material and around a portion of the fin positioned above the recessed upper surface.

One illustrative FinFET device disclosed herein includes, among other things, a fin that comprises opposing lateral sidewalls, a recessed layer of insulating material positioned in trenches adjacent opposite sides of the fin and a non-ferroelectric piezoelectric material liner layer positioned on and in contact with at least the opposing lateral sidewalls of the fin. In one illustrative example, the non-ferroelectric piezoelectric material liner layer has an upper surface that is approximately level with a level of the recessed layer of insulating material and the recessed layer of insulating material is positioned on and in contact with the non-ferroelectric piezoelectric material liner layer and a gate structure that is positioned around a portion of the fin and above the recessed layer of insulating material and above the upper surface of the non-ferroelectric piezoelectric material liner layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to a FinFET device comprising a piezoelectric liner and methods of making such a device. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. The gate structures for such a FinFET device may be formed using either "gate first" or "replacement gate" manufacturing techniques. Thus, the presently disclosed inventions should not be considered to be limited to the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2A:
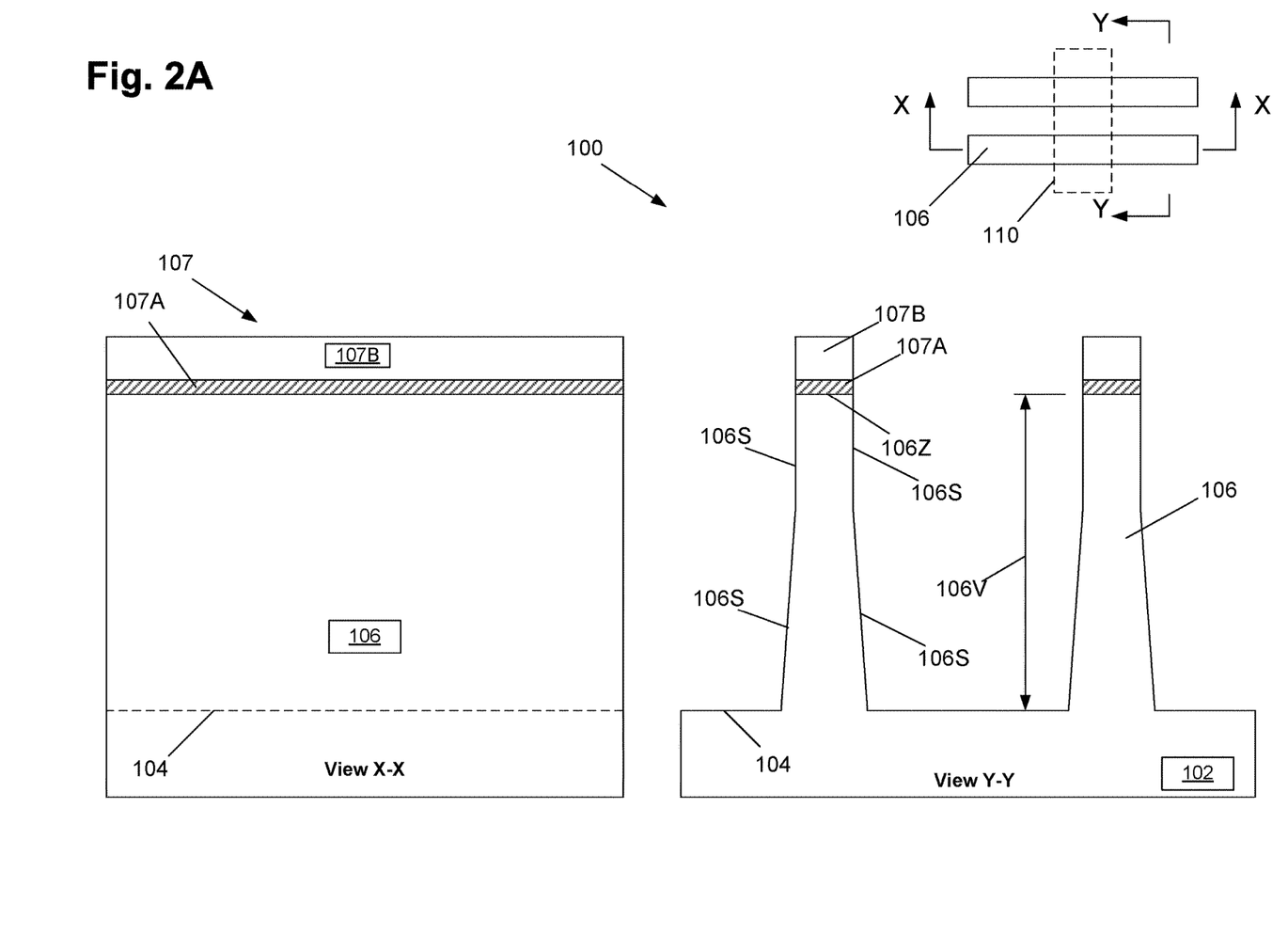
FIGS. 2A-2K depict various embodiments disclosed herein of a FinFET device comprising a piezoelectric liner for generating a surface charge and methods of making such a device.

FIGS. 2A-2K depict various examples of a FinFET device 100 comprising a piezoelectric liner and methods of making such a device. The FinFET device 100 may be formed with any desired number of fins 106. In the example depicted herein, the FinFET device 100 will be depicted as being comprised of two illustrative fins 106. Some of the figures contain a simplistic plan view showing where various cross-sectional views are taken in the drawings. With reference to FIG. 2A, the view X-X is a cross-sectional view taken through one of the fins 106 and the gate structure 110 (depicted in dashed lines at this point in the process) of the FinFET device 100 (in a direction corresponding to the current transport (gate length) direction of the device 100). The view Y-Y is a cross-sectional view taken across the fins 106 through one of the source/drain regions of the device 100 (in a direction corresponding to the gate width direction of the device). It should also be noted that, in some cases, the drawings contain a simplistic plan view that depicts at least some aspects of the processing reflected in the cross-sectional views. However, it should also be understood that no attempt has been made to reflect all of the processing steps (and resulting structures) shown in the cross-sectional views so as to not overly complicate the drawings.

With reference to FIG. 2A, the illustrative device 100 will be formed in and above a bulk semiconductor substrate 102. The device 100 may be either an N-type device or a P-type device. Additionally, various doped regions, e.g., source/drain regions, halo implant regions, well regions and the like, are not depicted in the attached drawings. The substrate 102 may be a bulk silicon substrate or it may be made of materials other than silicon. Thus, the terms "substrate" or "semiconductor substrate" should be understood to cover all semiconducting materials. The gate structures 110 for the illustrative transistor devices disclosed herein may be formed using well-known "gate first" or "replacement gate" manufacturing techniques.

FIG. 2A depicts the device 100 after several process operations were performed. First, one or more etching processes, e.g., anisotropic etching processes, were performed through a patterned fin-formation etch mask 107 to form a plurality of fin-formation trenches 104 in the substrate 102 and thereby define a plurality of fins 106. The patterned fin-formation etch mask 107 may be comprised of one or more layer of materials and it may be formed to any desired overall thickness, e.g., the patterned fin-formation hard mask may be comprised of a relatively thin layer of silicon dioxide 107A and a relatively thicker layer of silicon nitride 107B. The patterned fin-formation etch mask 107 may be formed by depositing the layer or layers of material for the patterned fin-formation etch mask 107 above the upper surface of the substrate 102 and thereafter patterning those layers of material using known photolithography and etching techniques.

With continuing reference to FIG. 2A, the lateral width and vertical height 106V (above the bottom surface of the trenches 104) of the fins 106 may vary depending upon the particular application. Additionally, the overall size, shape and configuration of the fin-formation trenches 104 and fins 106 may vary depending on the particular application. In the illustrative examples depicted in the attached drawings, the fin-formation trenches 104 and the fins 106 are all depicted as having a uniform size and shape. However, such uniformity in the size and shape of the trenches 104 and the fins 106 is not required to practice at least some aspects of the various inventions disclosed herein. In the attached figures, the fin-formation trenches 104 are depicted as having been formed by performing an anisotropic etching process that results in an upper portion of the fins 106 having a schematically (and simplistically) depicted, generally rectangular configuration while a lower portion of the fin 106 is outwardly tapered. The fins 106 comprise opposing lateral sidewalls 106S throughout its height 106V and an upper surface 106Z. Thus, the size and configuration of the trenches 104 and the fins 106, and the manner in which they are made, should not be considered a limitation of the present invention.

Figure 2B:
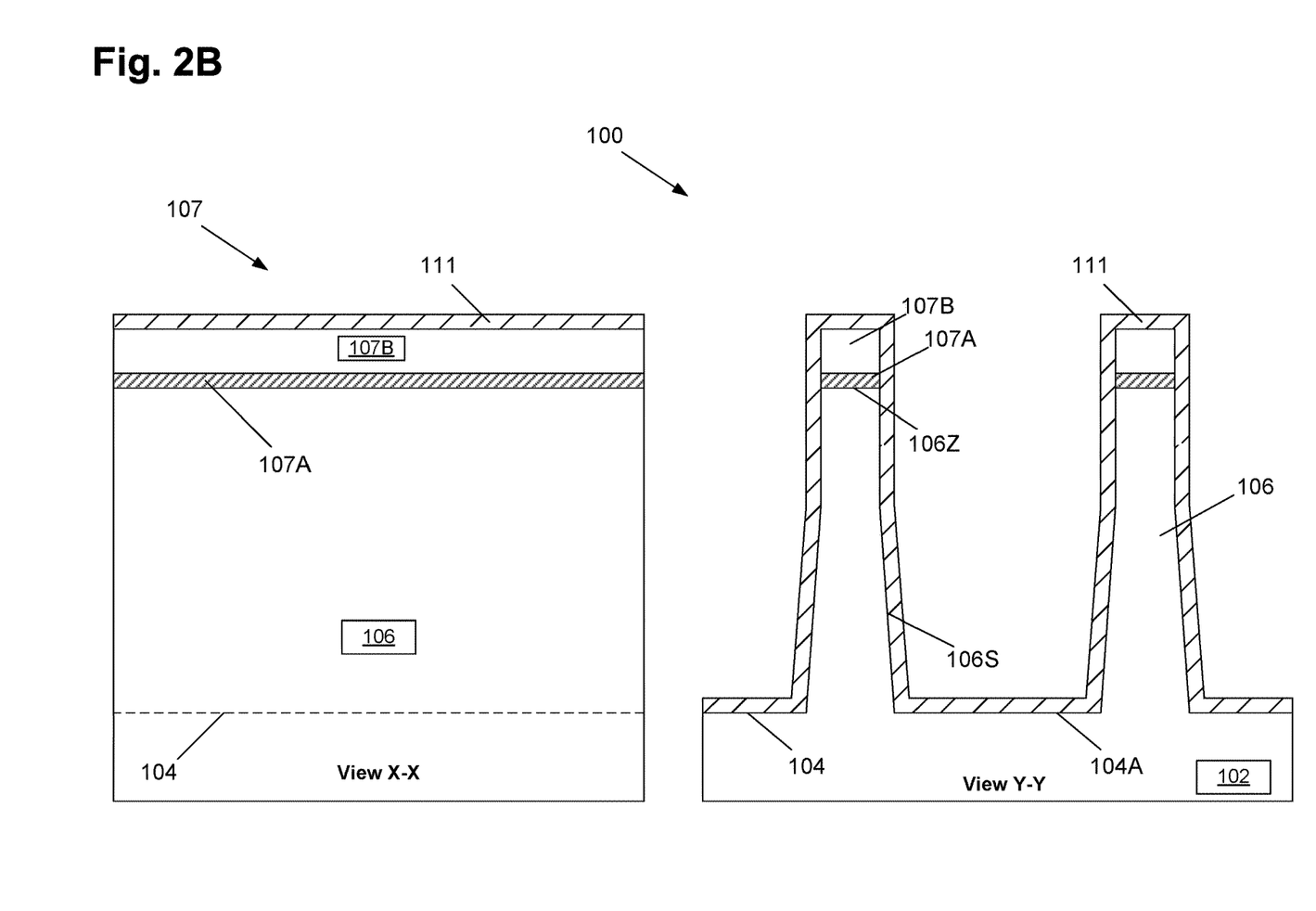

FIG. 2B depicts the device 100 after a conformal deposition process e.g., a conformal ALD or CVD process, was performed to form a conformal seed layer 111 on the sidewalls 106S of the fins 106 and on the bottom surface 104A of the trenches 104. In one illustrative example, the conformal seed layer 111 may be formed using the process described in Huang et al., "Effective Passivation of AlGaN/GaN HEMTs by ALD-Grown AlN Thin Film," *IEEE Electron Device Letters*, 33:516-18, 2012 (hereinafter the "Huang Publication"), which is hereby incorporated by reference in its entirety. Note that the conformal seed layer 111 is formed on the entire axial length (in the gate length direction of the device) of the fins 106 prior to the formation of any gate structure for the device 100. The thickness of the conformal seed layer 111 may vary depending upon the particular application (e.g., 0.5-5 nm) and it may be made of a variety of materials, e.g., aluminum oxide ($Al_2O_3$), $\alpha$-SiO2, sapphire, etc. In cases where metals are compatible, highly textured c-axis AlN can be grown on certain metals such as Pt (111), Ti (0001). Illustrative techniques for forming such highly textured c-axis AlN materials are described in the following publications, each of which is hereby incorporated by reference in its entirety: Martin et al., "Thickness dependence of the properties of highly c-axis textured AlN thin films," *J. Vac. Sci. Technol. A*, 22(2):361-64, 2004 (hereinafter the "Martin Publication"); Engelmark et al., "Structural and electroacoustic studies of AlN thin films during low temperature radio frequency sputter deposition," *J. Vac. Sci. Technol. A*, 19-2664-69, 2001 (hereinafter the "Engelmark Publication"); and Kirste et al., "Polarity control and growth of lateral polarity structures in AlN," *Applied Physics Letters*, 102:181913, 2013 (hereinafter the "Kirste Publication").

Figure 2C:
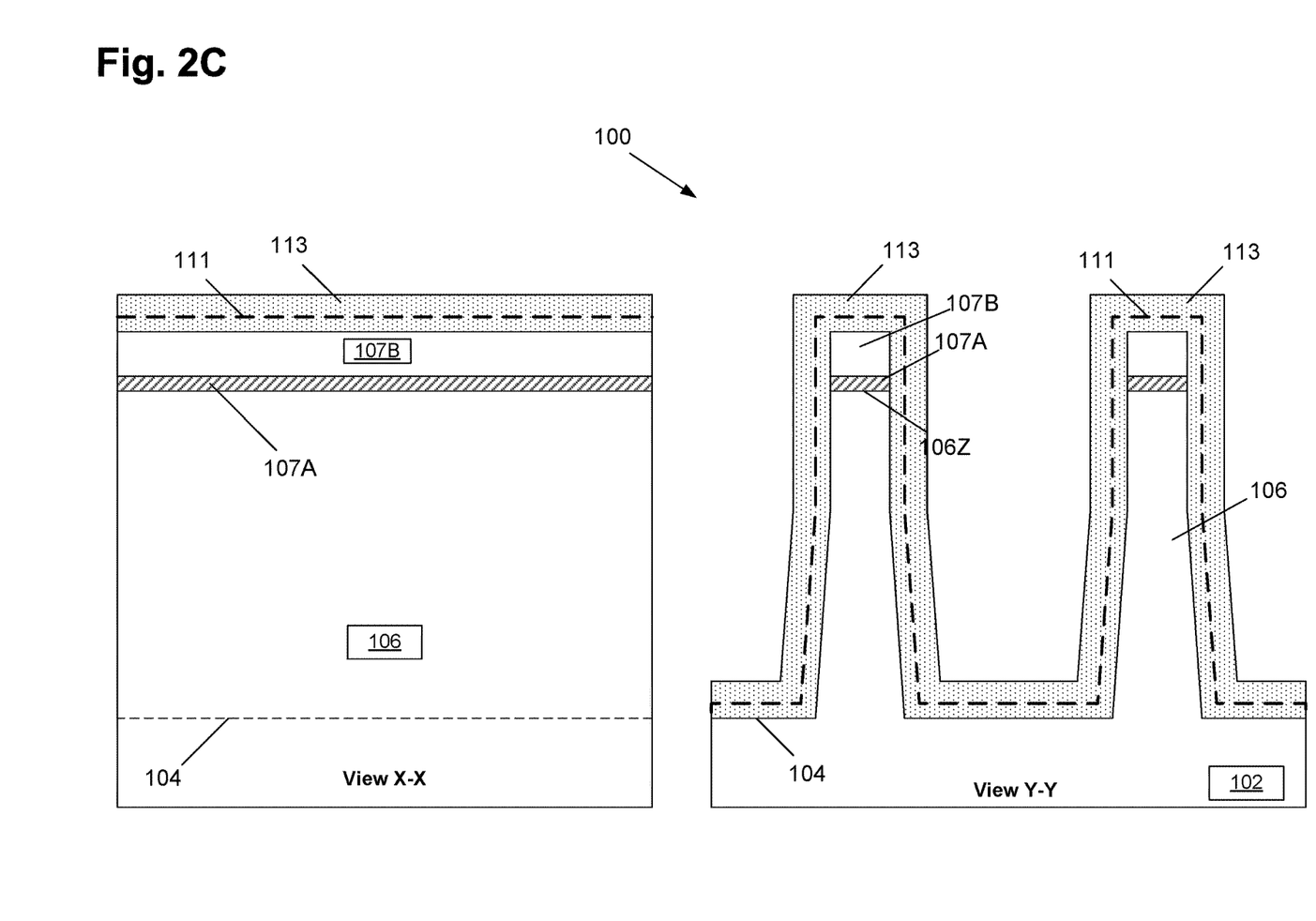

FIG. 2C depicts the device 100 after an epitaxial growth process was performed to form a substantially conformal piezoelectric material liner layer 113 on the seed layer 111. A number of methods have been reported for growing of aluminum nitride. One of the most prevalent methods is a pulsed DC magnetron sputtering process (as discussed and described in the Martin Publication). This pulsed DC magnetron sputtering process enables the growth of highly textured c-axis oriented films on substrates such as $\alpha$-$SiO_2$. Note that the piezoelectric material liner layer 113 is formed on the entire axial length (in the gate length direction) of the fins 106 prior to the formation of any gate structure for the device 100. The seed layer 111 is depicted in dashed lines in FIG. 2C simply for reference purposes and the dashed lines representing the original seed layer 111 have been omitted in the subsequent drawings as it may or may not be partially or entirely consumed during the formation of the piezoelectric material liner layer 113. Irrespective of the presence or absence of the original seed layer 111 after formation of the piezoelectric material liner layer 113, the piezoelectric material liner layer 113 shall be understood as being formed on and in contact with the fin for purposes of this application and the appended claims. The piezoelectric material liner layer 113 disclosed herein may be made from a variety of non-ferroelectric materials, e.g., zinc oxide (ZnO), aluminum nitride (AlN), gallium nitride (GaN), etc. In one particular example, the piezoelectric material liner layer 113 may be comprised of zinc oxide and it may be formed using a Vapor Liquid Solid (VLS) technique, an Aqueous Chemical Growth (ACG) method or by performing a pulsed DC magnetron sputtering process, as described in the Martin Publication. The thickness of the piezoelectric material liner layer 113 may vary depending upon the particular application (e.g., 2-3 nm). It should also be noted that various ferroelectric materials, such as lead zirconate titanate (PZT), lead magnesium niobate-lead titanate (PMN-PT), can be grown on silicon. However, use of such ferroelectric materials would require performing an extra step of polarizing such ferroelectric materials.

Figure 2D:
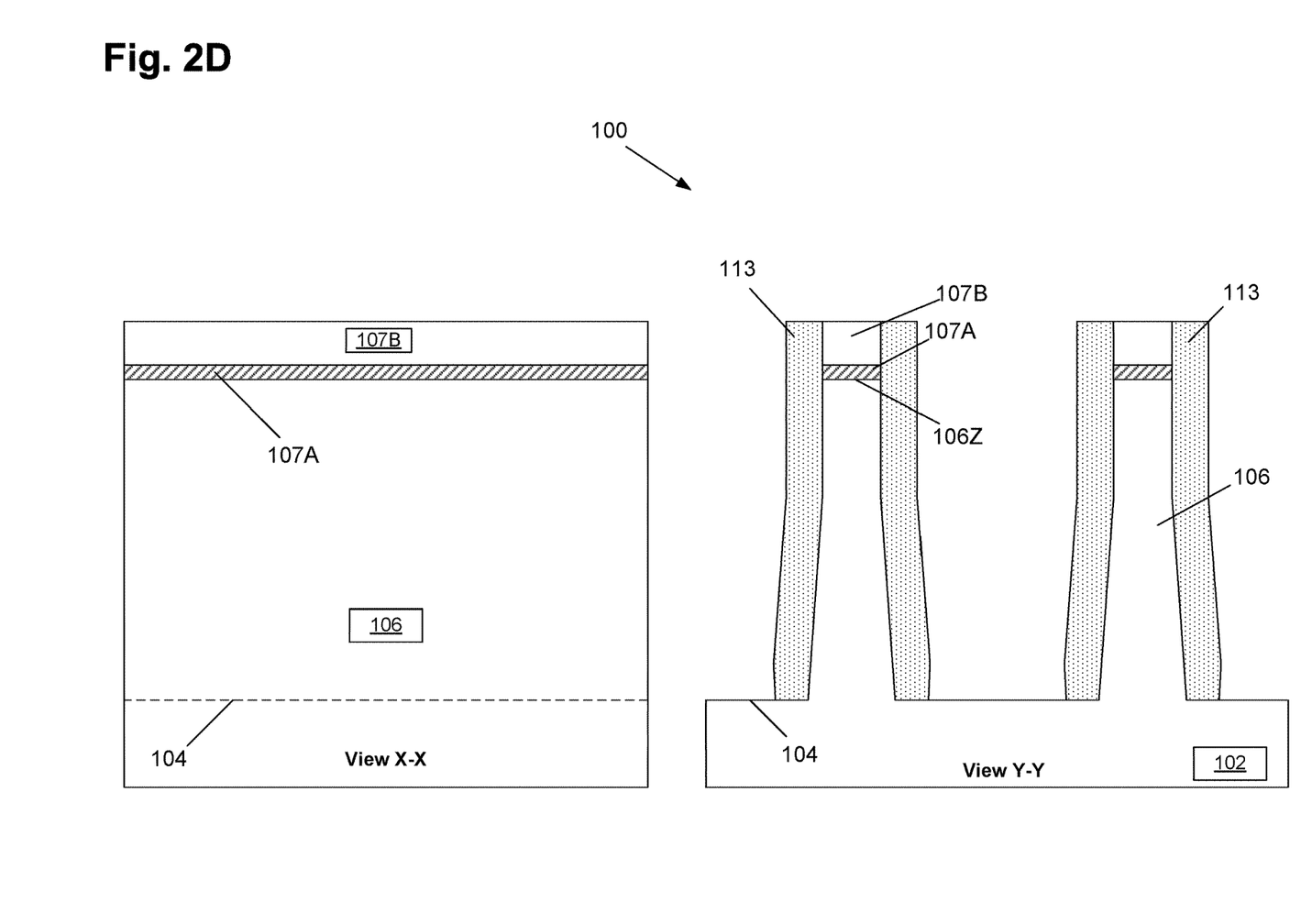

FIG. 2D depicts the device 100 after an anisotropic etching process (RIE) was performed to remove all of the substantially horizontally positioned portions of the piezoelectric material liner layer 113.

Figure 2E:
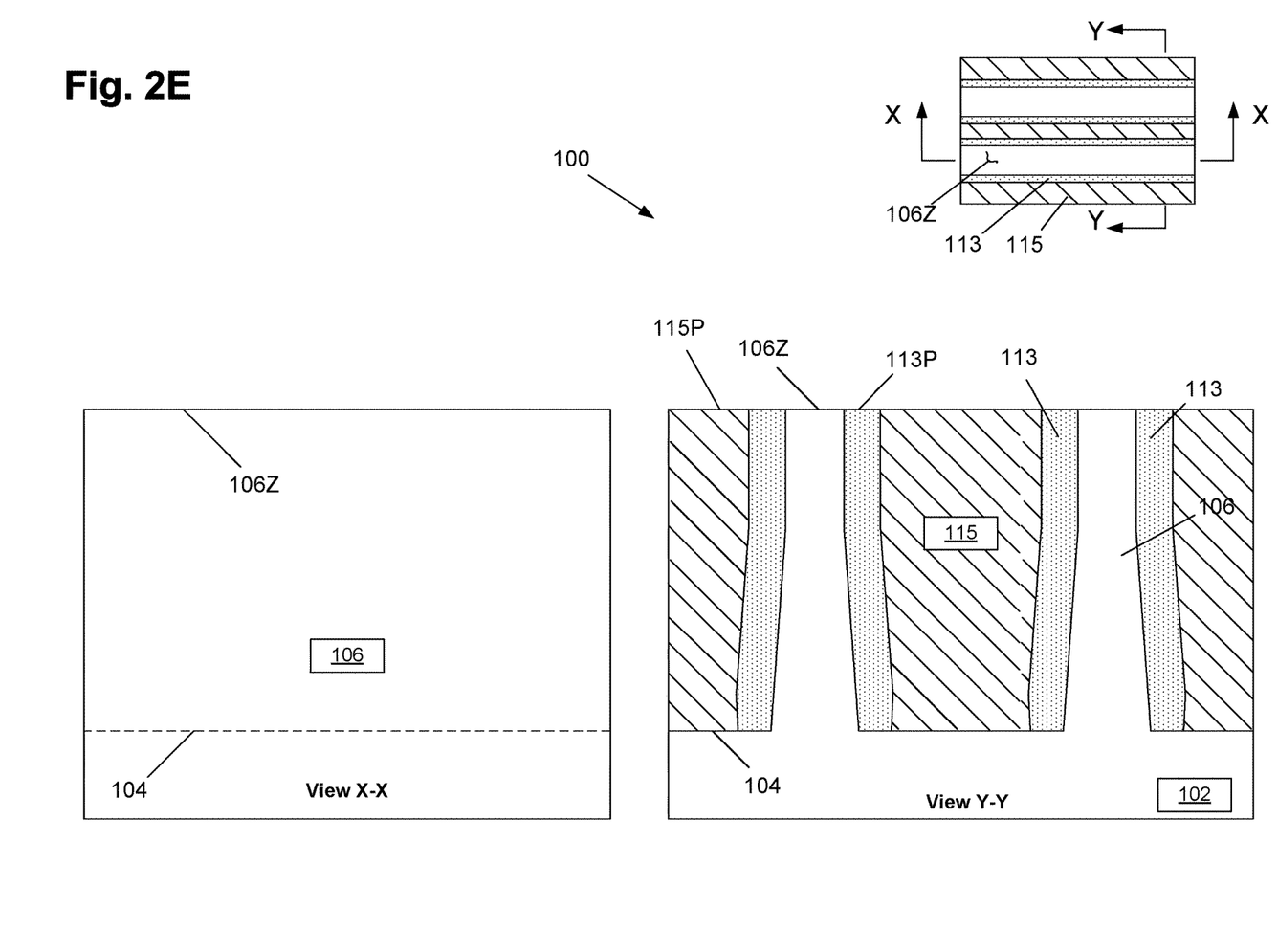

FIG. 2E depicts the device 100 after several process operations were performed. First, a layer of insulating material 115 (e.g., silicon dioxide, HDP oxide, silicon nitride, etc.) was deposited so as to overfill the fin-formation trenches 104 such that its as-deposited upper surface was at a level above the upper surface of the patterned etch mask 107. Thereafter, at least one process operation, such as a chemical mechanical polishing (CMP) process, was performed to planarize the layer of insulating material 115 using the upper surface 106Z of the fins 106 as a polish-stop. This polishing process removes the patterned fin-formation etch mask 107. The layer of insulating material 115 now has a polished upper surface 115P. This process operation also removes the piezoelectric material liner layer 113 from above the upper surface 106Z of the fins 106 which are now exposed.

Figure 2F:
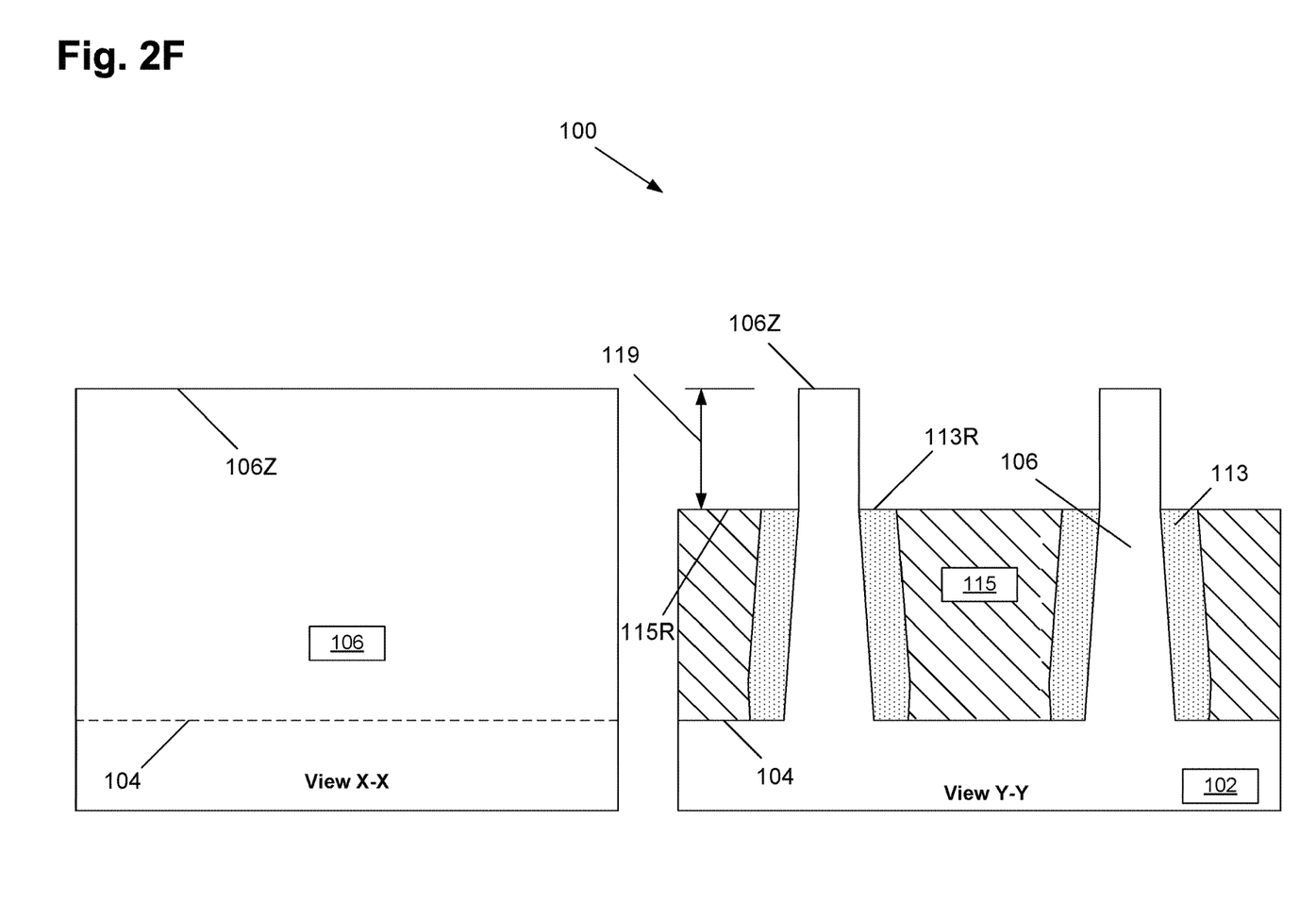

FIG. 2F depicts the device 100 after several process operations were performed. First, in one embodiment, a timed, recess etching process was performed on the layer of insulating material 115 to remove portions of the layer of insulating material 115 within the trenches selectively relative to the piezoelectric material liner layer 113. At the completion of the recess etch process, the layer of insulating material 115 has a recessed upper surface 115R. Thereafter, a selective recess etching process was performed on the piezoelectric material liner layer 113 to remove the portions of the piezoelectric material liner layer 113 positioned above the recessed upper surface 115R of the recessed layer of insulating material 115. Note that the piezoelectric material liner layer 113 now has a recessed upper surface 113R that is approximately level with the recessed upper surface 115R of the recessed layer of insulating material 115. As depicted, these process operations result in the exposure of a desired amount 119 of the fin 106 above the recessed upper surface 115R of the recessed layer of insulating material 115. The amount 119 of the fin 106 that is exposed may vary depending upon the particular application.

Figure 2G:
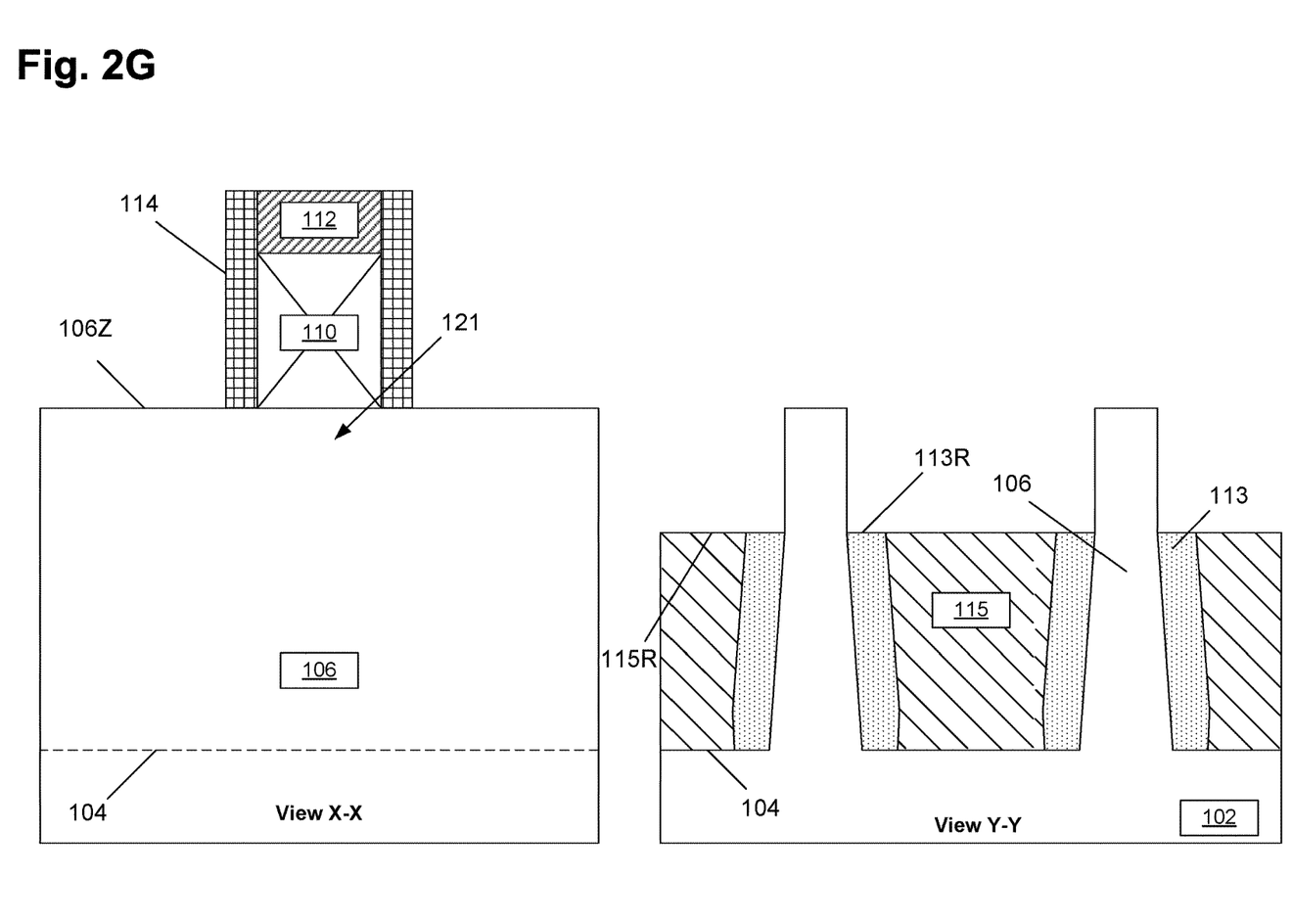
Figure 2H:
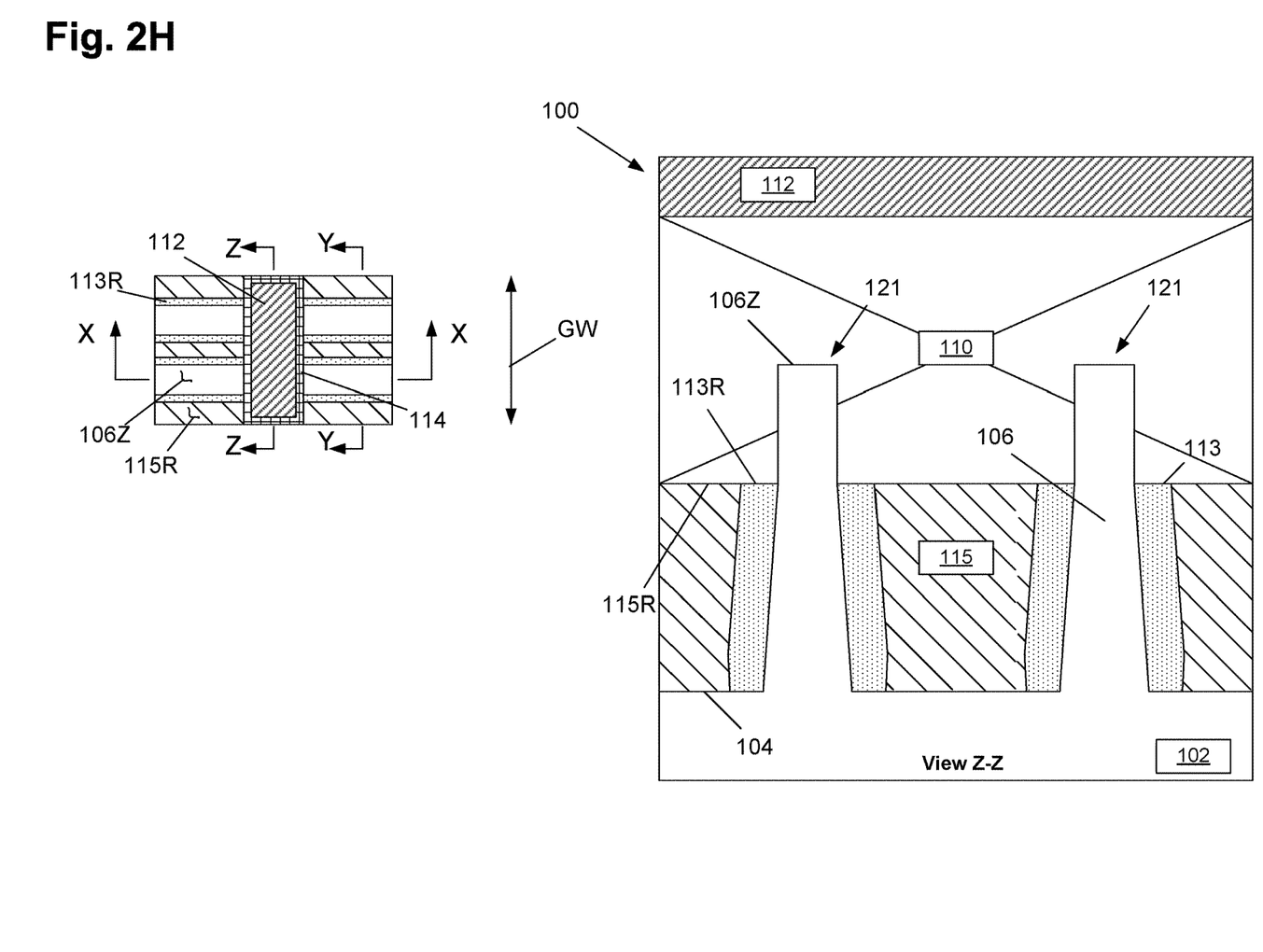

FIG. 2G (views X-X and Y-Y) and FIG. 2H (view Z-Z) depicts the product after a simplistically depicted gate structure 110 with a gate cap 112 was formed above the fins 106 and after an illustrative sidewall spacer 114 was formed adjacent the gate structure 110. The view Z-Z is a cross-sectional view taken through the gate structure 110 in the gate width (GW) direction of the device, as shown in the simplistic plan view in FIG. 2H. The gate structure 110 covers a portion of the fins 106 that will become the channel region 121 of the device 100 during operation. Also note that the gate structure 110 is positioned on and in contact with the recessed upper surface 113R of the piezoelectric material liner layer 113 at a location that is approximately level with the recessed upper surface 115R of the recessed layer of insulating material 115.

The gate structure 110 may be a final gate structure (a gate-first manufacturing process) or it may be a sacrificial gate structure (for a replacement gate manufacturing process). The gate structure 110 may be comprised of a gate insulation layer (not separately shown), e.g., silicon dioxide or a high-k material having a dielectric constant greater than 10, and a gate electrode comprised of one or more layers of conductive material (not separately shown), e.g., metal-containing materials. The gate cap 112 may be comprised of a material such as, for example, silicon nitride. To form the sidewall spacer 114, a conformal deposition process, e.g., a conformal ALD or CVD process, was performed to form a conformal layer of spacer material across the fins 106 and the previously formed gate structure 110 and gate cap 112. Then, an anisotropic etching process was performed on the layer of spacer material. The spacer 114 may be made of a variety of materials, e.g., silicon nitride, etc.

At this point, the device 100 may be completed by performing various traditional manufacturing techniques, e.g., various ion implantation processes may be performed to form various doped regions in at least the portions of the fins 106 positioned in the source/drain regions of the device 100, additional epi semiconductor material (not shown) may be formed in the source/drain regions of the device, conductive contacts may be formed to establish a conductive electrical path to the source/drain regions and the gate structure 110, etc.

Figure 2I:
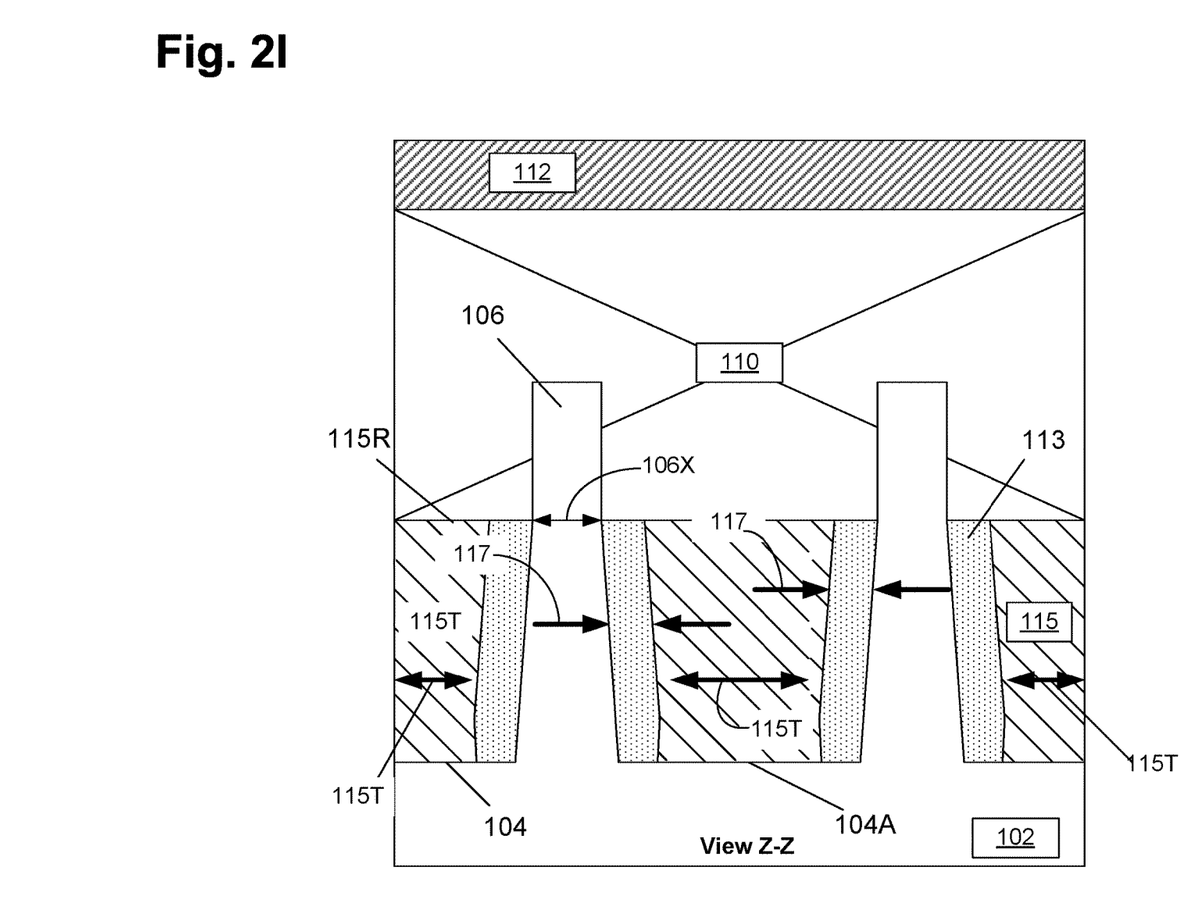

With reference to FIG. 2I, various operational aspects of the novel devices disclosed herein will now be discussed. FIG. 2I is a cross-sectional view (Z-Z) taken through the gate structure 110 in the gate width direction of the device that depicts the channel region of the device 100. In general, the layer of insulating material 115 has an as-deposited intrinsic tensile stress, as indicated by the double arrow 115T. The magnitude of this tensile stress 115T may vary depending upon the material of the layer of insulating material 115 and the manner in which it is formed. In the illustrative example where the layer of insulating material 115 is a layer of silicon dioxide that was formed by performing a CVD process using the process described in the Huang Publication, the tensile stress 115T may be on the order of about 300-500 MPa.

In turn, the tensile stress 115T in the layer of insulating material 115 exerts a compressive stress on the piezoelectric material liner layer 113, as indicated by the arrows 117. When exposed to a sufficient compressive stress, the piezoelectric material liner layer 113 will generate an interfacial charge or surface charge layer (not shown in FIG. 2I) at or near the outer surface of the fin 106 where the piezoelectric material liner layer 113 contacts the fin 106, i.e., in the fin 106 that extends below the level of the recessed upper surface 115R of the recessed layer of insulating material 115. Stated another way, the interfacial charge or surface charge layer does not form to any appreciable extent in the portions of the fin 106 that extend above the level of the recessed upper surface 115R of the layer of insulating material 115. Importantly, the interfacial charge layer will form in the portion of the fin 106 located vertically under the gate structure 110 in the channel region of the device starting at about the upper recessed surface 115R and extending downward into the fin 106 to at least the bottom 104A of the fin-formation trenches 104. Similarly, the interfacial charge layer will be formed in the fins 106 under the source/drain regions and extend downward into the fin 106 to the bottom 104A of the fin-formation trenches 104. Due to the fact that the interfacial charge layer is created by application of an appropriate compressive stress on the piezoelectric material liner layer 113, the interfacial charge layer is created at the time the recessed layer of insulating material 115 is formed on the piezoelectric material liner layer 113. The magnitude of the compressive stress that needs to be applied to the piezoelectric material liner layer 113 to achieve the results predicted herein may vary depending upon the particular application and the material used for the piezoelectric material liner layer 113. In one illustrative embodiment, where the piezoelectric material liner layer 113 is comprised of AlN, the magnitude of the compressive stress applied to the piezoelectric material liner layer 113 may be at least about 200-500 MPa to achieve the required surface charge.

With reference to FIG. 2I, as one example for current day applications, assuming that the lateral width 106X (in the gate width direction) of the fin 106 at a location that is approximate level with the upper recessed surface 115R is approximately 12 nm and that a charge density required from the piezoelectric material liner layer 113 sufficient to function as a punch-through stop is about $2e^{18}$ cm$^{-3}$, then the required surface charge density from the piezoelectric material liner layer 113 would need to be on the order of about 0.00192 C/m$^2$ ($2e^{18}*12e^{-7}\div 2$). In the case where the piezoelectric material liner layer 113 comprises AlN or ZnO, such a surface charge density may be achievable at a compressive stress level much lower than 200 MPa.

The epi growth process that is performed to form the piezoelectric material liner layer 113 may be performed in such a manner such that the interfacial charge layer generated by the piezoelectric material liner layer 113 may be either positive or negative. In order to achieve positive or negative surface charges in AlN, c-axis orientation in either Al-polar (0001) or N-polar (000-1) directions are required. The control of such polarity in AlN, and also GaN, has been an active area of research. In one example, as described in the Kirste Publication, polarity control in AlN material (and GaN material in previous research by the same group) was achieved by making use of a low temperature buffer layer to achieve one type of polarity, wherein the opposite polarity was achieved by removing the low temperature buffer layer. As such, the Al-polar layer was grown where the low temperature buffer layer remained, while the N-polar layer was grown where the low temperature buffer layer was removed. In another example, Al adatoms were predeposited to obtain N-polar (000-1) AlN on Si(111) substrates, while the Al-polar (0001) layers were obtained with the predeposition step removed, as described in Dasgupta et al., "Growth of high quality N-polar AlN (0001⁻) on Si(111) by plasma assisted molecular beam epitaxy," *Applied Physics Letters*, 94:151906, 2009 (hereinafter the "Dasgupta Publication"), which is hereby incorporated by reference in its entirety. Therefore, the combination of preferential growth that is c-axis aligned is necessary to obtain the piezoelectric response. Highly textured films are obtained using methods such as plasma assisted MOCVD, or plasma enhanced DC magnetron sputtering. As noted above, the use of a buffer layer, or predeposition of adatoms, can invert the polarity of such films.

Figure 2J:
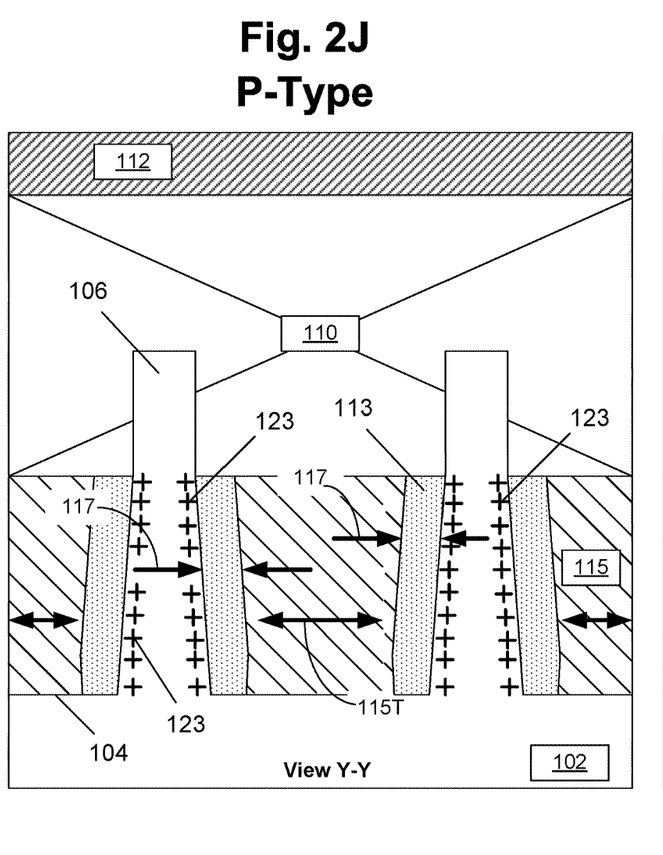
Figure 2K:
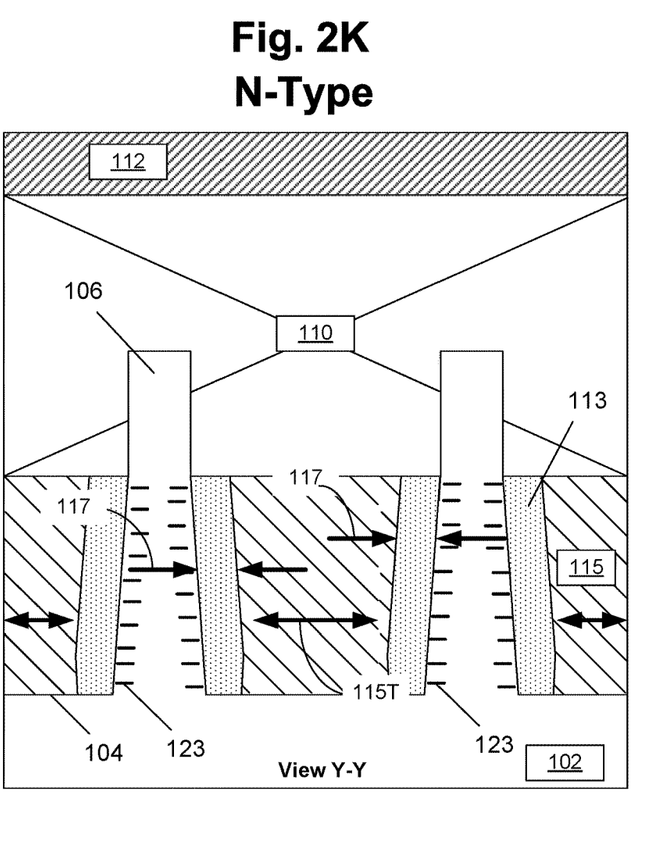

FIG. 2J depicts an illustrative example where the FinFET device 100 is a P-type device and wherein the interfacial charge layer 123 was formed such that it exerts a positive interfacial charge as reflected by the "+" symbols. FIG. 2K depicts an illustrative example where the FinFET device 100 is an N-type device and wherein the interfacial charge layer 123 was formed such that it exerts a negative interfacial charge as reflected by the "−" symbols.

As will be appreciated by those skilled in the art after a complete reading of the present application, using the devices and methods disclosed herein will provide device designers with a means to prevent or reduce unwanted punch-through leakage currents without the formation of doped punch-through stopped regions in the fins, such as those described in the background section of the application. As shown above, the piezoelectric material liner layer 113 can be relatively precisely positioned at the desired location on the fins 106 since it is formed by a combination of deposition—etch processes, which in turn should enable more accurate placement of the interfacial charge layer 123—the mechanism that functions so as to reduce or eliminate the subthreshold currents—relative to the bottom of the doped source/drain regions (not shown) formed in the fin above the recessed layer of insulating material 115. Other advantages of using the devices and methods disclosed herein will be appreciated by those skilled in the art after a complete reading of the present application.

In the case of CMOS-based integrated circuit products, various processing operations are possible using the methods and devices disclosed herein. In some CMOS applications, it may be desirable to form the piezoelectric material liner layer 113 on only one type of device, e.g., the piezoelectric material liner layer 113 may only be formed on NFET devices but not on the PFET devices. That may be accomplished by initially forming a single piezoelectric material liner layer 113 on both the N-type and P-type devices and thereafter forming a patterned masking layer that covers the N-type devices and exposes the P-type devices. Then, the exposed portions of the piezoelectric material liner layer 113 may be removed from the P-type devices. The process flow may be reversed if it is desired to form the piezoelectric material liner layer 113 only on the P-type devices but not on the N-type devices.

In CMOS applications where it is desirable to form appropriate piezoelectric material liner layers 113 on both P-type and N-type devices, the following process flow may be used. A first piezoelectric material liner layer may be deposited on both types of devices and thereafter selectively removed from a first type of devices using the above-described masking and etching process. Thereafter, a second piezoelectric material liner layer may be deposited on both types of devices (including the remaining portions of the first piezoelectric material liner layer). Then, desired portions of the piezoelectric material liner layer may be selectively removed from above the remaining portions of the first piezoelectric material liner layer, while leaving portions of the second piezoelectric material liner layer positioned above devices of the second type (which is opposite to the first type of device).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device, comprising:
   forming a plurality of fin-formation trenches in a semiconductor substrate so as to thereby form a fin that comprises opposing lateral sidewalls;
   forming a conformal piezoelectric material liner layer on at least said opposing lateral sidewalls of said fin;
   forming a recessed layer of insulating material in said fin-formation trenches and on said conformal piezoelectric material liner layer, said recessed layer of insulating material having a recessed upper surface;
   removing portions of said conformal piezoelectric material liner layer positioned above said recessed upper surface to thereby expose a portion of said fin above said recessed upper surface; and
   forming a gate structure above said recessed upper surface and around a portion of said fin positioned above said recessed upper surface.

2. The method of claim 1, wherein forming said conformal piezoelectric material liner layer comprises:
   performing a conformal deposition process to form a conformal seed layer material in said fin-formation trenches and at least on said opposing sidewalls of said fin; and
   performing at least one epitaxial growth process to form said conformal piezoelectric material liner layer on said conformal seed layer, wherein said conformal piezoelectric material liner layer comprises a non-ferroelectric material.

3. The method of claim 1, wherein forming said conformal piezoelectric material liner layer comprises forming said conformal piezoelectric material liner layer above an upper surface of a patterned etch mask positioned above an upper surface of said fin.

4. The method of claim 1, wherein forming said gate structure above said recessed upper surface comprises forming said gate structure on and in contact with an upper surface of said conformal piezoelectric material liner layer positioned at a location that is approximately level with a level of said recessed upper surface of said recessed layer of insulating material.

5. The method of claim 4, wherein forming said gate structure above said recessed upper surface of said recessed layer of insulating material comprises forming said gate structure on and in contact with an upper surface of said fin.

6. The method of claim 1, wherein said FinFET device is an N-type device and wherein forming said conformal piezoelectric material liner layer comprises forming said conformal piezoelectric material liner layer such that it generates a negatively charged interfacial charge layer when subjected to a compressive stress.

7. The method of claim 1, wherein said FinFET device is a P-type device and wherein forming said conformal piezoelectric material liner layer comprises forming said conformal piezoelectric material liner layer such that it generates a positively charged interfacial charge layer when subjected to a compressive stress.

8. The method of claim 2, wherein said conformal seed layer material comprises one of aluminum oxide ($Al_2O_3$), α-$SiO_2$ or sapphire, said conformal piezoelectric material liner comprises one of zinc oxide (ZnO), aluminum nitride (AlN) or gallium nitride (GaN) and said recessed layer of insulating material comprises one of silicon dioxide or silicon nitride.

9. The method of claim 1, wherein forming said recessed layer of insulating material in said trenches comprises forming a tensile-stressed recessed layer of insulating material.

10. The method of claim 1, wherein forming said conformal piezoelectric material liner layer comprises forming said conformal piezoelectric material liner layer at least on said opposing lateral sidewalls of said fin and on a bottom surface of said fin-formation trenches and wherein the method further comprises performing an anisotropic etching process to remove substantially all of said conformal piezoelectric material liner layer positioned on said bottom surfaces of said fin-formation trenches while leaving portions of said conformal piezoelectric material liner layer positioned on at least said opposing lateral sidewalls of said fin.

11. The method of claim 3, wherein forming said recessed layer of insulating material in said trenches comprises:
    depositing a layer of insulating material so as to over-fill said fin-formation trenches, said deposited layer of insulating material having an as-deposited upper surface that is at a level that is above a level of said upper surface of said patterned etch mask; and
    performing at least one chemical mechanical polishing process to remove said patterned etch mask positioned above said upper surface of said fin and to remove portions of said conformal piezoelectric material liner layer positioned above a level of said upper surface of said fin.

12. The method of claim 1, wherein said conformal piezoelectric material liner layer comprises a non-ferroelectric material.

13. A method of forming a FinFET device, comprising:
    forming a plurality of fin-formation trenches in a semiconductor substrate so as to thereby form a fin that comprises opposing lateral sidewalls, said fin-formation trenches having a bottom surface;
    performing a conformal deposition process to form a conformal seed layer on said opposing lateral sidewalls of said fin and on said bottom surface of said fin-formation trenches;
    performing at least one epitaxial growth process to form a conformal non-ferroelectric piezoelectric material liner layer on said conformal seed layer;
    performing an anisotropic etching process to remove substantially all of said conformal non-ferroelectric piezoelectric material liner layer positioned on said bottom surface of said fin-formation trenches while leaving portions of said conformal non-ferroelectric piezoelectric material liner layer positioned on at least said opposing lateral sidewalls of said fin;
    forming a tensile-stressed recessed layer of insulating material in said fin-formation trenches and on said conformal non-ferroelectric piezoelectric material liner layer, said recessed layer of insulating material having a recessed upper surface;
    removing portions of said conformal non-ferroelectric piezoelectric material liner layer positioned above said recessed upper surface to thereby expose a portion of said fin above said recessed upper surface; and
    forming a gate structure above said recessed upper surface and around a portion of said fin positioned above said recessed upper surface.

14. The method of claim 13, wherein forming said conformal seed layer comprises forming said conformal seed layer above an upper surface of a patterned etch mask positioned above an upper surface of said fin.

15. The method of claim 13, wherein forming said gate structure above said recessed upper surface comprises forming said gate structure on and in contact with an upper surface of said conformal non-ferroelectric piezoelectric material liner layer positioned at a location that is approximately level with a level of said recessed upper surface of said recessed layer of insulating material.

* * * * *